United States Patent
Nam et al.

(10) Patent No.: US 7,616,497 B2
(45) Date of Patent: Nov. 10, 2009

(54) NOR FLASH MEMORY AND RELATED READ METHOD

(75) Inventors: Sang-wan Nam, Suwon-si (KR); Dae-han Kim, Seoul (KR)

(73) Assignee: Samsung Electronics Co. Ltd., Suwon-si, Gyeonggi-do (KR)

( * ) Notice: Subject to any disclaimer, the term of this patent is extended or adjusted under 35 U.S.C. 154(b) by 305 days.

(21) Appl. No.: 11/606,029

(22) Filed: Nov. 30, 2006

(65) Prior Publication Data

US 2007/0171723 A1 Jul. 26, 2007

(30) Foreign Application Priority Data

Jan. 23, 2006 (KR) .............. 10-2006-0006870

(51) Int. Cl.
*G11C 16/06* (2006.01)
*G11C 7/02* (2006.01)

(52) U.S. Cl. .............. 365/185.21; 365/206; 365/208

(58) Field of Classification Search .......... 365/185.21
See application file for complete search history.

(56) References Cited

U.S. PATENT DOCUMENTS

| | | | |
|---|---|---|---|
| 6,052,313 A | 4/2000 | Atsumi et al. | |
| 6,208,564 B1 * | 3/2001 | Yamada et al. | 365/189.07 |
| 6,246,609 B1 * | 6/2001 | Akaogi | 365/185.23 |
| 6,353,575 B2 * | 3/2002 | Lee | 365/230.03 |
| 6,466,488 B2 * | 10/2002 | Sowards et al. | 365/189.07 |
| 6,967,894 B2 * | 11/2005 | Kondo | 365/185.17 |
| 7,265,596 B2 * | 9/2007 | Kang et al. | 327/161 |
| 2002/0027452 A1 | 3/2002 | Atsumi et al. | |
| 2002/0048196 A1 * | 4/2002 | Kwon et al. | 365/189.12 |
| 2003/0026160 A1 | 2/2003 | Atsumi et al. | |
| 2004/0174751 A1 * | 9/2004 | Edo | 365/193 |
| 2005/0135183 A1 | 6/2005 | Kondo | |
| 2007/0258304 A1 * | 11/2007 | Chen et al. | 365/208 |

FOREIGN PATENT DOCUMENTS

| | | |
|---|---|---|
| JP | 11-025686 | 1/1999 |
| JP | 2005-182872 | 7/2005 |
| KR | 1020000015640 | 3/2000 |
| KR | 1020050061359 | 6/2005 |

* cited by examiner

*Primary Examiner*—Son L Mai
(74) *Attorney, Agent, or Firm*—Volentine & Whitt, PLLC

(57) ABSTRACT

A NOR flash memory is disclosed including a memory cell, sense amplifier output driver, and control circuit. A sense period for a sense operation performed by the sense amplifier is made synchronous with a clock signal so as to avoid power supply or ground signal noise generated by operation of the output driver.

16 Claims, 4 Drawing Sheets

NOR FLASH MEMORY AND RELATED READ METHOD

BACKGROUND OF THE INVENTION

1. Field of the Invention

The present invention relates to semiconductor memory devices. More particularly, the invention relates to NOR flash memory and a related read method.

This application claims priority under 35 U.S.C § 119 to Korean Patent Application 2006-06870 filed on Jan. 23, 2006, the subject matter of which is hereby incorporated by reference.

2. Discussion of Related Art

Semiconductor memory devices are used in an increasing range of host devices to store data. Semiconductor memory devices are roughly categorized into a random access memory (RAM) and a read only memory (ROM). RAM is volatile in nature in that stored data is lost when power is interrupted. RAM includes dynamic RAM, static RAM, and the like. In contrast, ROM is nonvolatile in nature and stored data is retained following interruption of applied power. ROM includes programmable ROM (PROM), erasable PROM (EPROM), electrically EPROM (EEPROM) including flash memory, and the like.

Flash memory may be further classified as NAND flash memory and NOR flash memory. NAND flash memory is characterized by a string of series connected memory cells connected to a bit line, while NOR flash memory is characterized by memory cells connected in parallel with a bit line.

FIG. 1A shows a cross-section view of a memory cell in a NOR flash memory. FIG. 1B shows an equivalent circuit for the memory cell illustrated in FIG. 1A and its bias condition during a read operation.

Referring to FIG. 1A, a memory cell 10 includes a source 3, a drain 4, a first insulating film 5, a floating gate 6, a second insulating film 7, a control gate 8, and a substrate 9. The source 3 and drain 4 are formed on the p-type substrate 9.

The source 3 is connected to a source line SL, and drain 4 is connected to a bit line BL. Floating gate 6 is formed over and separated from a channel region by first insulating film 5 having a thickness (e.g.,) below about 100 nm. Control gate 8 is formed over and separated from floating gate 6 by second insulating film 7 (e.g., an ONO film). Control gate 8 is connected to a word line WL. Substrate 9 is biased with a bulk voltage BK.

The source 3, drain 4, control gate 8, and substrate 9 of memory cell 10 are supplied respectively with control voltages defined in relation to program/erase/read operations.

Referring to FIG. 1B, during a read operation, the source 3 receives a source line voltage of about 0V, drain 4 receives a bit line voltage of about 1V, and control gate 8 receives a word line voltage of about 5V. During the read operation, a bulk voltage of about 0V is applied to substrate 9.

If a read operation is carried out under the above-described bias conditions, and assuming the exemplary memory cell is being programmed, it may be seen that the current path between drain 4 and source 3 is cut-off. On the other hand, during an erase operation, the current path persists between drain 4 and source 3. Using conventional terminology, the programmed memory cell is said to be "OFF", while the erased memory cell is said to be "ON".

In general, NOR flash memories include a sense amplifier and an output driver adapted to read data from the memory cell during a read operation. The sense amplifier senses data stored in each memory cell, and the output driver develops output signals based on the sensed data capable of being exported to a host device or some other external circuit.

Both sense amplifier and output driver may be respectively supplied with a power supply voltage Vcc and a ground voltage Vss through a power terminal and a ground terminal. The output driver receives the power supply voltage Vcc or the ground voltage Vss and outputs sensed data in synchronization with a clock signal CLK. In general, the output driver may output 1-byte or 1-word data every clock cycle.

However, the sense amplifier performs its sense operation regardless of the clock signal (asynchronously). Since a conventional NOR flash memory performs sense operations asynchronously in relation to the clock signal CLK, sense operation failures may arise. Sense operation failure will be more fully described hereafter with reference to FIG. 3.

However, it should be noted at this point that as the output driver outputs data, it may also generate noise. Power supply or ground related noise generated by the output driver may corrupt the power supply voltage Vcc or a ground voltage Vss applied to the sense amplifier. The presence of noise on the power supply voltage Vcc or ground voltage Vss may actually result in sense operation failures in the conventional NOR flash memory.

SUMMARY OF THE INVENTION

In one embodiment, the invention provides a NOR flash memory comprising; a memory cell, a sense amplifier adapted to perform a sense operation sensing data stored in the memory cell during a sense period, an output driver adapted to output data sensed by the sense amplifier, and a control circuit adapted to synchronously control the timing of the sense period in relation to a clock signal.

In another embodiment, the invention provides a read method for a NOR flash memory comprising; generating a sense signal in response to a clock signal, sensing data stored in a memory cell in response to the sense signal, and outputting the sensed data.

In another embodiment, the invention provides a read method for a NOR flash memory comprising; by operation of a control circuit, generating a sense signal having a defined sense period in response to a clock signal and applying the sense signal to a sense amplifier, by operation of the sense amplifier, sensing data stored in a memory cell in response to the sense signal outside of times when noise is apparent on a power supply or ground voltage applied to the sense amplifier, by operation of a output driver, outputting the sensed data, and commonly providing the power supply voltage or ground voltage to the sense amplifier and the output driver, such that the noise apparent on a power supply or ground voltage applied to the sense amplifier is related to output of the sensed data by the output driver.

DESCRIPTION OF EMBODIMENTS

Embodiments of the invention will now be described more fully with reference to the accompanying drawings. The invention may, however, be embodied in many different forms and should not be construed as being limited to only the illustrated embodiments. Rather, these embodiments are presented as teaching examples. Throughout the written description and drawings, like reference numbers refer to like or similar elements.

Figure 1A:
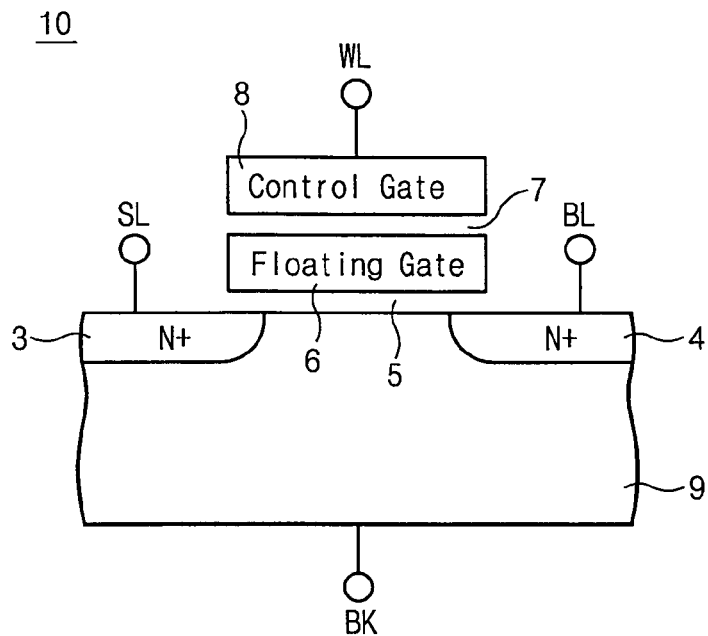
FIG. 1A shows a cross-section view of a memory cell of a NOR flash memory.
Figure 1B:
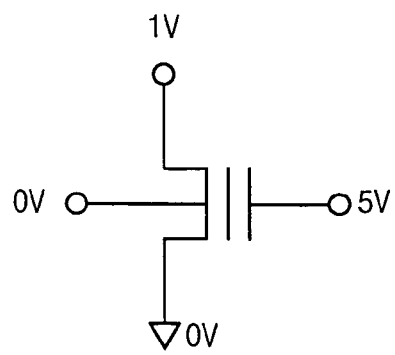
FIG. 1B shows a circuit symbol of a memory cell illustrated in FIG. 1A and its bias condition at a read operation.
Figure 2:
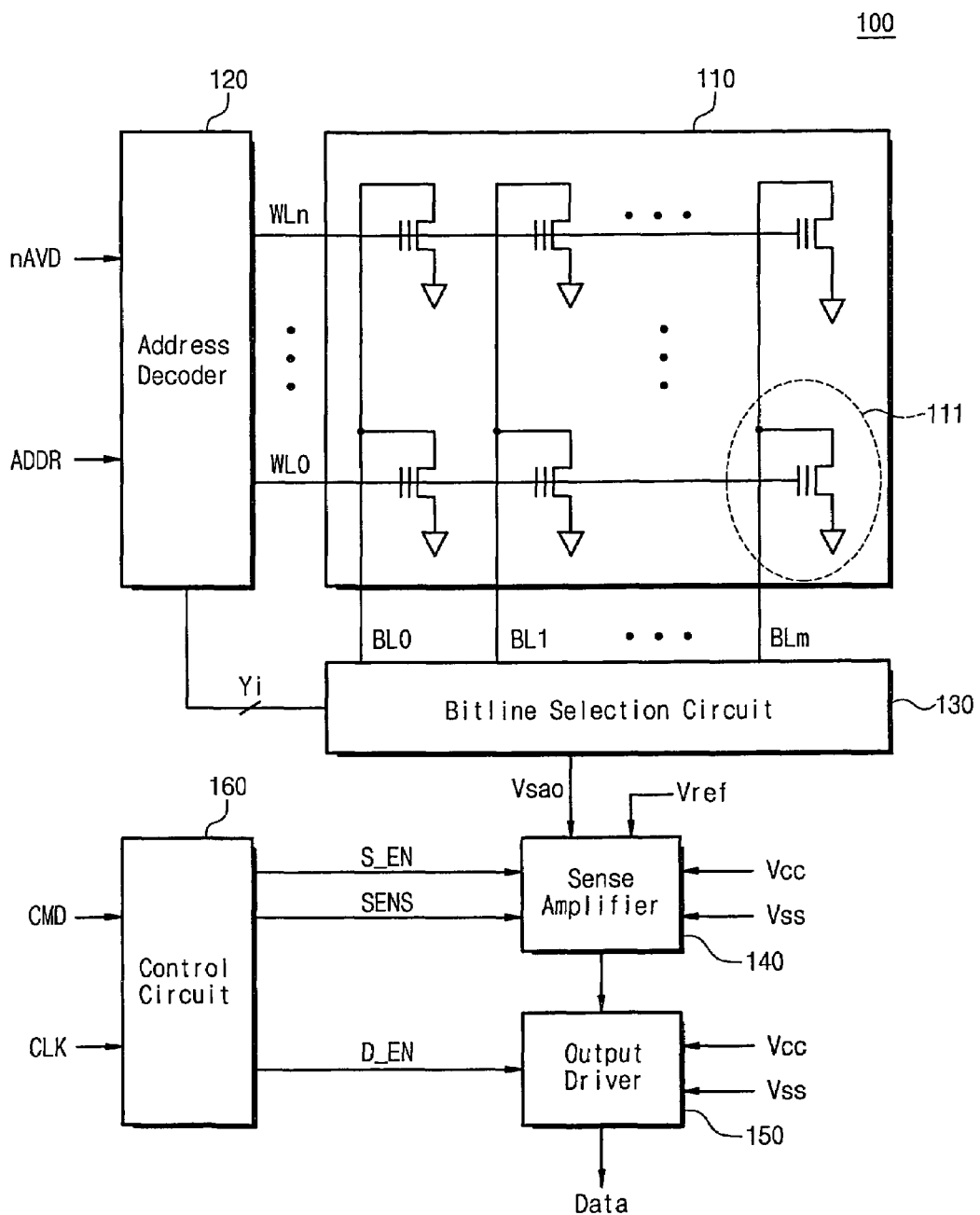
FIG. 2 is a block diagram showing a NOR flash memory according to the present invention.

FIG. 2 is a block diagram showing a NOR flash memory according to an embodiment of the invention. Referring to FIG. 2, a NOR flash memory 100 includes a memory cell array 110, an address decoder 120, a bit line selection circuit 130, a sense amplifier 140, an output driver 150, and a control circuit 160.

Memory cell array 110 includes an array of memory cells. The memory cells are connected to word lines WL0 to WLn and bit lines BL0 to BLm. In this manner, each memory cell is supplied with a word line voltage via a word line WL and with a bit line voltage via a bit line BL.

Each memory cell in NOR flash memory 100 may be adapted to store a single bit of data. Such memory cells are referred to as single bit (or level) cells (SLC). Alternately, each memory cell may be adapted to store "N" bits of data (where N is an integer greater than 1). Such memory cells are referred to as multi-level cells (MLC). A MLC adapted to store 2 bits of data may be programmed to one of four data state: '11', '10', '01' and '00'. Each of these four data states may be discriminated in relation to variations in current flowing through the memory cell during a read operation.

Address decoder 120 decodes an externally supplied address signal ADDR and selects a word line and a bit line in relation to the decoded address signal and an applied address valid signal nAVD.

The address signal ADDR is commonly divided into a row address RA selecting between word lines WL0 to WLn and a column address CA selecting between bit lines BL0 to BLm. FIG. 2 illustrates a case wherein word line WL0 and bit line BLm are selected by the decoded address signal. As a result of this word line and bit line selection a single memory cell 111 is selected Bit line selection circuit 130 selects a bit line in response to a selection signal Yi (i=0–m) received from address decoder 120. Although not shown in FIG. 2, bit line selection circuit 130 may be implemented using a plurality of NMOS transistors, each connected between a bit line and a corresponding sense node. For example, when selection signal Ym is enabled, bit line BLm and a corresponding sense node SA0 are electrically connected. An output signal from sense node SA0, Vsao, is applied to sense amplifier 140.

Sense amplifier 140 compares the sense node voltage Vsao with a reference voltage Vref during the read operation. Reference voltage Vref may be supplied by a conventional reference voltage generating circuit (not shown). Sense amplifier 140 performs a sense operation using a power supply voltage Vcc or a ground voltage Vss. For purposes of this description, it is assumed that the power supply voltage Vcc and/or the ground voltage Vss are supplied through power/ground pins associated with the NOR flash memory. Sense amplifier 140 receives control signals S_EN and SENS from control circuit 160 during the sense operation. The control signal S_EN is an enable signal for sense amplifier 140, and the control signal SENS is a sense signal indicating a sense operation to sense amplifier 140.

Output driver 150 outputs data sensed by sense amplifier 140 during the read operation and is power by power supply voltage Vcc or a ground voltage Vss. Output driver 150 also receives an enable signal D_EN from control circuit 160 during the read operation.

Control circuit 160 generates the control signals, such as S_EN, SENS and D_EN in response to externally supplied commands CMD. Control circuit 160 generates the sense signal SENS in response to a clock signal CLK and adjusts the phase of the sense signal SENS in relation to same. As noted this synchronous sense signal SENS is applied to sense amplifier 140 which performs a sense operation in response to same.

Control circuit 160 may include a signal generator adapted to the generation of the sense signal SENS in response to the clock signal CLK and a phase shift circuit adapted to adjust the phase of the sense signal SENS supplied to sense amplifier 140. The phase shift circuit determines a point in time when the sense signal SENS is thus supplied.

Figure 3:
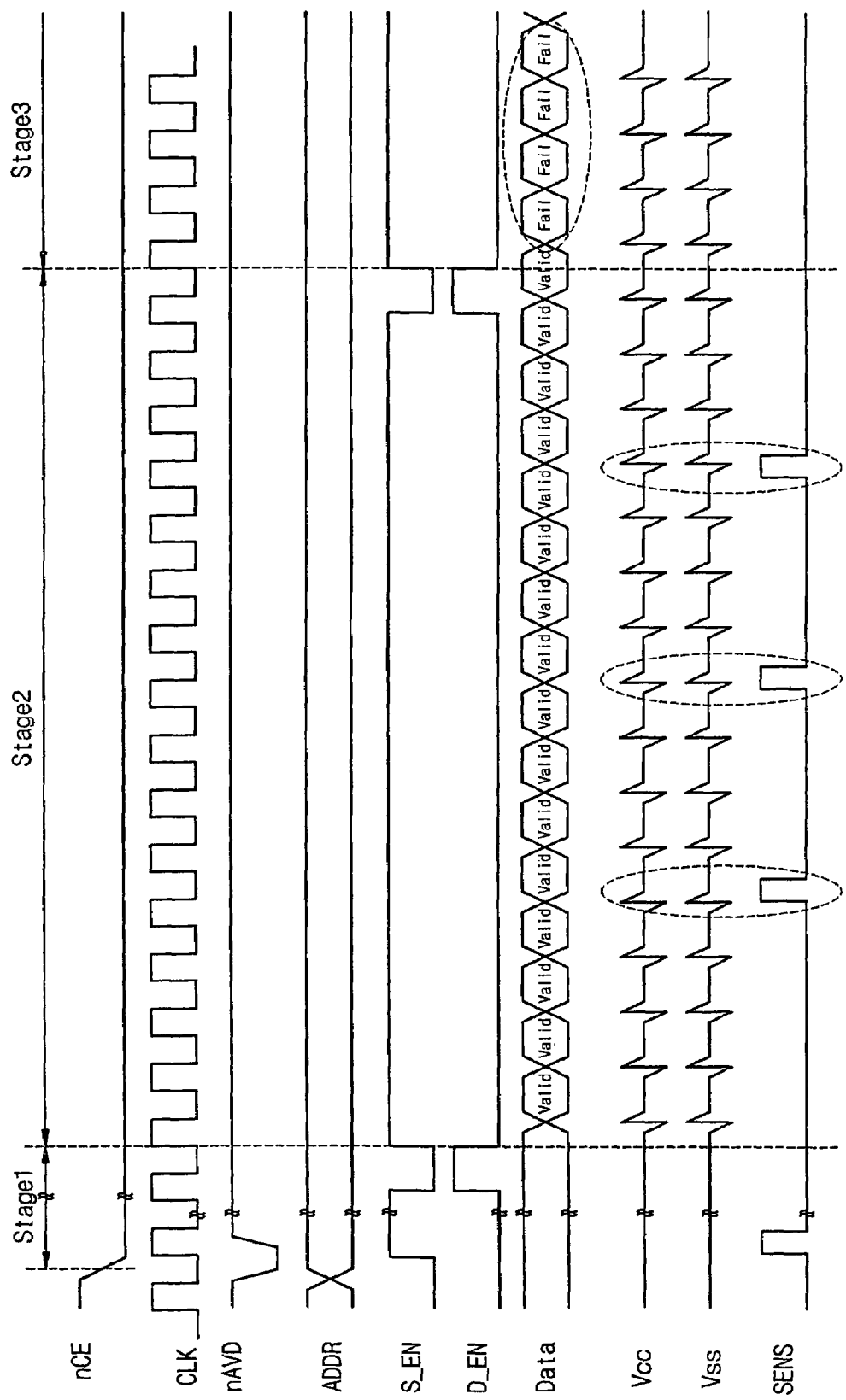
FIGS. 3 and 4 are timing diagrams for describing a read operation of a NOR flash memory illustrated in FIG. 2.
Figure 4:
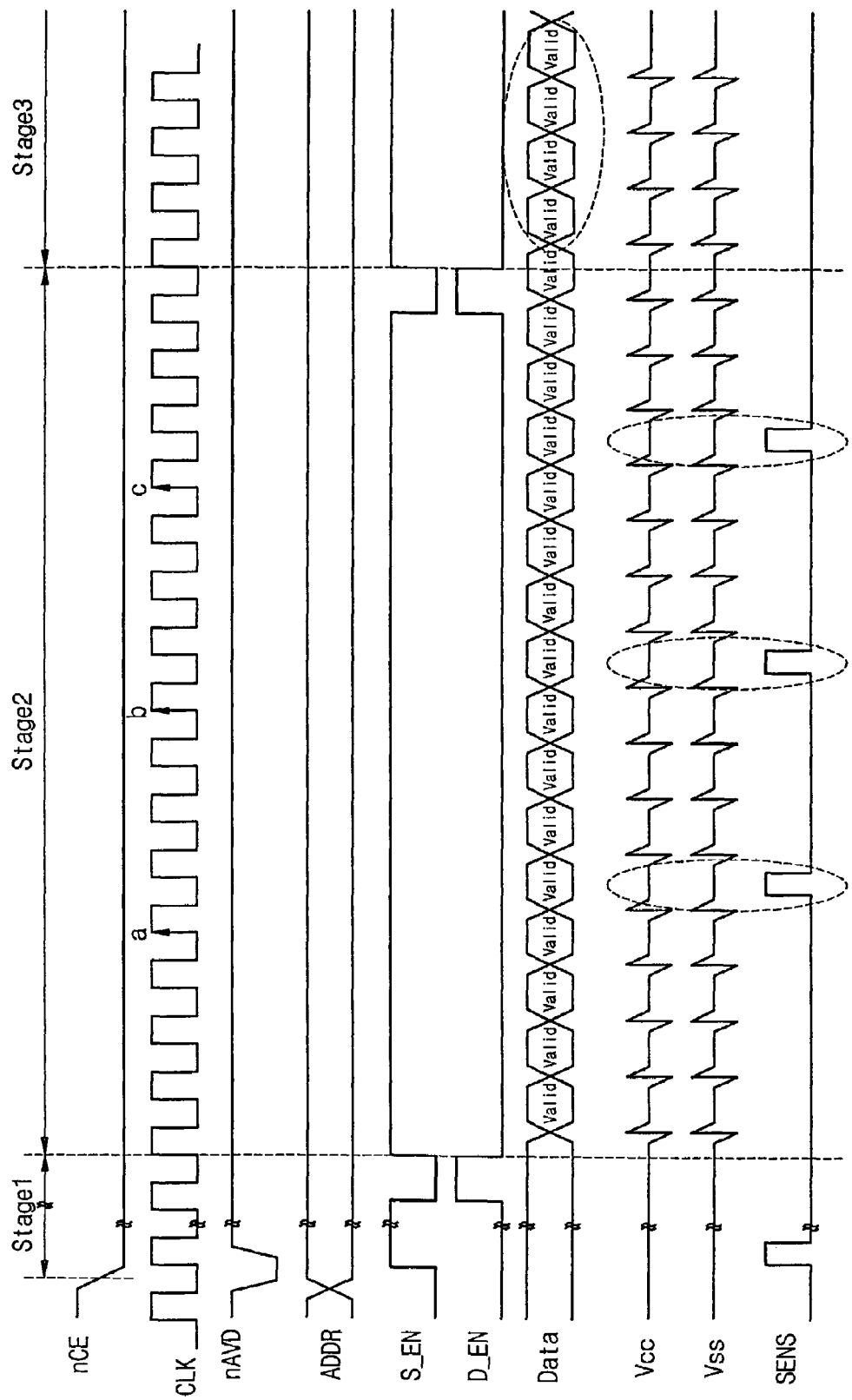

FIGS. 3 and 4 are timing diagrams further delineating an exemplary read operation performed by the NOR flash memory illustrated in FIG. 2. In the working example, NOR flash memory 100 performs read operations in synchronization with the clock signal CLK. FIG. 3 shows a case where a sense operation failure arises due to the presence of noise on a power supply or ground voltage. FIG. 4 shows a comparative case where the sense operation is normally performed by avoiding the adverse affects of power supply/ground noise.

Referring to FIGS. 3 and 4 in relation to the memory device illustrated in FIG. 2, an exemplary read operation is accomplished in three stages. Data sensed within the first stage is output within the second stage, and data sensed within the second stage is output within the third stage.

First, a chip enable signal nCE transitions to a low logic level (hereafter a "low"). While an address valid signal nAVD is maintained at low, a burst read operation is performed in synchronization with a rising edge of the clock signal CLK.

Referring to FIG. 3, an address ADDR is received within the first stage. Sense amplifier 140 operates responsive to an enable signal S_EN and performs a sense operation in response to the sense signal SENS. Of note, the sense signal SENS is received regardless of the state of clock signal CLK. Output driver 150 operates in response to the enable signal D_EN, and outputs sensed data in synchronization with the clock signal CLK during the second stage.

In the second stage, power supply or ground noise may arise when output driver 150 outputs data. Such noise affects the sense operation of sense amplifier 140. As illustrated in FIG. 3, if sense amplifier 140 sense data at a point in time when power supply or ground noise is generated, the sense operation may fail during the third stage. (See, dotted line circled areas in FIG. 3).

FIG. 4 shows the case where a sense operation is normally performed by controlling of the sense operation period. Control circuit 160 generates the sense signal SENS only at rising edges of the clock signal CLK. (See, FIG. 4, at the points marked "a", "b" and "c"). By providing the sense signal SENS in this manner, the possible affects of the power supply or ground noise may be avoided.

Referring to FIG. 4, it is assumed that noise is generated during the period in which output driver 150 outputs data. However, control circuit 160 avoids this noise-critical period as it provides the sense signal SENS to sense amplifier 140. Accordingly, in a NOR flash memory according to an embodiment of the invention, it is possible to prevent a sense operation failure during the third stage of a read operation and ensure the output of valid read data.

In sum, conventional NOR flash memory performs a sense operation regardless of the clock signal CLK, so that a sense operation failure may arise due to power supply or ground noise. However, a NOR flash memory according to an embodiment of the invention performs a sense operation synchronously with the clock signal. As such, the likelihood of a sense operation failure due to a power supply or ground noise is greatly reduced. Within the context of embodiments of the invention, the sense margin for data states in a MLC within the NOR flash memory may be further ensured. Further, in embodiments of the present invention characterized by a limited pin count, a single power or ground pin may be used in relation to multiple circuits with the NOR flash memory, including the output driver, for example.

Although the invention has been described in connection with several embodiments illustrated in the accompanying drawings, it is not limited thereto. It will be apparent to those skilled in the art that various substitution, modifications and changes may be thereto without departing from the scope of the invention as defined by the following claims.

What is claimed is:

1. A nonvolatile memory comprising:
   a memory cell;
   a sense amplifier adapted to perform a sense operation sensing data stored in the memory cell in response to a sense signal during a sense period;
   an output driver adapted to output data sensed by the sense amplifier; and
   a control circuit adapted to provide the sense signal to the sense amplifier at times other than times when noise is apparent on a power supply voltage or ground voltage applied to the sense amplifier.

2. The nonvolatile memory of claim 1, wherein the control circuit is further adapted to provide the sense signal, synchronous with a clock signal, to the sense amplifier.

3. The nonvolatile memory of claim 2, wherein the control circuit comprises:
   a signal generator adapted to generate the sense signal in response to the clock signal; and
   a phase shift circuit adapted to shift the phase of the sense signal to avoid the times when noise is apparent on a power supply voltage or ground voltage applied to the sense amplifier.

4. The nonvolatile memory of claim 1, wherein the times when noise is apparent on a power supply voltage or ground voltage applied to the sense amplifier are related to operation of the output driver.

5. A nonvolatile memory comprising:
   a memory cell;
   a sense amplifier adapted to perform a sense operation sensing data stored in the memory cell during a sense period;
   an output driver adapted to output data sensed by the sense amplifier; and
   a control circuit adapted to synchronously control timing of the sense period in relation to a clock signal, wherein the control circuit sets the sense period in such a manner that sense operation failures, otherwise resulting from noise on a power supply voltage or ground voltage applied to the sense amplifier, are minimized.

6. The nonvolatile memory of claim 5, wherein the noise on the power supply voltage or ground voltage is related to operation of the output driver.

7. The nonvolatile memory of claim 1, wherein the memory cell is adapted to store multi-bit data.

8. The nonvolatile memory of claim 7, wherein the multi-bit data is two bit data defined by four data states.

9. A read method for a nonvolatile memory comprising:
   generating a sense signal in response to a clock signal;
   providing a sense signal to a sense amplifier at time other than times when noise is apparent on a power supply or ground voltage applied to the sense amplifier;
   sensing data stored in a memory cell in response to the sense signal; and
   outputting the sensed data.

10. The read method of claim 9, wherein sensing data is performed by the sense amplifier connected to the memory cell, the sensed data is output through an output driver connected to the sense amplifier, and the sense signal is generated with a defined sense period by a control circuit.

11. The read method of claim 10, wherein the times when noise is apparent on a power supply voltage or ground voltage applied to the sense amplifier are related to operation of the output driver.

12. The read method of claim 9, wherein the memory cell is adapted to store multi-bit data.

13. A read method for a nonvolatile memory comprising:
   by operation of a control circuit, generating a sense signal having a defined sense period in response to a clock signal and applying the sense signal to a sense amplifier;
   by operation of the sense amplifier, sensing data stored in a memory cell in response to the sense signal outside of times when noise is apparent on a power supply voltage or ground voltage applied to the sense amplifier;
   by operation of an output driver, outputting the sensed data; and
   commonly providing the power supply voltage or ground voltage to the sense amplifier and the output driver from a single power supply voltage or ground pin, such that the noise apparent on a power supply voltage or ground voltage applied to the sense amplifier is related to output of the sensed data by the output driver.

14. The read method of claim 13, wherein output driver output of the sensed data by the output driver is performed synchronously with the clock signal.

15. The read method of claim 13, wherein the memory cell is adapted to store multi-bit data.

16. The read method of claim 14, wherein the multi-bit data is two bit data defined by four data states.

* * * * *